United States Patent [19]
Cadet et al.

[11] Patent Number: 5,427,659
[45] Date of Patent: Jun. 27, 1995

[54] PROCESS FOR THE MANUFACTURE OF DEVICES

[75] Inventors: Gardy Cadet, Newark; James W. Mitchell, Somerset; Jorge L. Valdes, Bedminster, all of N.J.

[73] Assignee: AT&T Corp., Murray Hill, N.J.

[21] Appl. No.: 23,159

[22] Filed: Feb. 25, 1993

Related U.S. Application Data

[63] Continuation of Ser. No. 714,326, Jun. 11, 1991, abandoned, which is a continuation of Ser. No. 588,523, Sep. 18, 1990, abandoned, which is a continuation of Ser. No. 339,344, Apr. 18, 1989, abandoned.

[51] Int. Cl.$^6$ ................................................ C25B 1/02
[52] U.S. Cl. .................................... 204/101; 204/129; 423/645; 437/104; 437/107; 437/132; 437/133
[58] Field of Search ................ 204/101, 129; 423/645; 437/104, 107, 132, 133, 900

[56] References Cited

U.S. PATENT DOCUMENTS

| | | | |
|---|---|---|---|
| 1,375,819 | 4/1921 | Blumenberg, Jr. | 204/101 |
| 3,404,076 | 10/1968 | Haycock et al. | 204/101 |
| 4,178,224 | 12/1979 | Porter | 204/237 |

FOREIGN PATENT DOCUMENTS 1033576  8/1983  U.S.S.R.

OTHER PUBLICATIONS

Salzberg et al., Arsine Evolution and Water Reduction at an Arsenic Cathode, Apr. 1990, pp. 348–353.
R. H. Moss, *Journal of Crystal Growth* 68, 78 (1984).
M. J. Ludowise, C. B. Cooper III, and R. R. Saxena, *J. Electron. Mat.* 10, 1051 (1981).
J. P. Duchenain, J. P. Hirtz, M. Razeghi, M. Bonnet, and S. D. Hersee, *J. Cryst. Growth* 55, 64 (1981).
H. M. Manasenit, W. I. Simpson, *J. Electrochem. Soc.* 122, 444 (1971).
F. Goodridge and A. R. Wright, "Porous Flow-through and Fluidized–Bed Electrodes" in *Comprehensive Treatise of Electrochemistry*, vol. 6, Chap 6 p. 393 (1983) Plenum Press, New York.
The BOCA® National Fire Prevention Code/1987 Building Officials and Code Administrations, Int. Inc. 7th Ed. Country Club Hills, Ill. 60477.
*Ann. Rev. Mater. Sci.* 12, 243–269 (1982) (Dapkus).
*Journal of Crystal Growth* 68, 345–355 (1984) (Dapkus).

*Primary Examiner*—John Niebling
*Assistant Examiner*—Edna Wong
*Attorney, Agent, or Firm*—Bruce S. Schneider

[57] ABSTRACT

Many devices, such as those based on III-V semiconductor materials, are produced utilizing gases such as arsine that require careful handling of compressed gas cylinders. This care has engendered a search for alternate approaches. It has been found that the use of electrochemically generated gases such as arsine yields an efficient, pure source of such gases without necessitating the storage of large gas quantifies. Thus, a device fabrication procedure including in situ electrochemical generation of gases such as arsine is particularly useful.

3 Claims, 2 Drawing Sheets

PROCESS FOR THE MANUFACTURE OF DEVICES

This application is a continuation of application Ser. No. 07/714,326, filed on Jun. 11, 1991, (now abandoned), which is a continuation of Ser. No. 07/588,523, filed on Sep. 18, 1990 (now abandoned), which is a continuation of Ser. No. 07/339,344, filed on Apr. 18, 1989 (now abandoned).

BACKGROUND OF THE INVENTION

1. Field of the Invention

This invention relates to the manufacture of devices and, in particular, the manufacture with gases of electronic devices.

2. Art Background

The manufacture of many electronic and optical devices involves the formation of materials from gas phase precursors. For example, integrated circuits based on GaAs have just become commercially viable for specialty applications and rely on precursors such as arsine. Additionally, compound semiconductor materials, e.g. III-V materials such as gallium arsenide phosphide, indium gallium arsenide phosphide, indium gallium arsenide, indium arsenide, indium aluminum arsenide phosphide, gallium aluminum arsenide, and gallium arsenide antimonide, formed from precursors such as arsine, phosphine and stibine, are widely used in the fabrication of solid state lasers, light emitting diodes, field effect transistors, and photodetectors.

A variety of gas phase fabrication procedures such as metal organic chemical vapor deposition (MOCVD), hydride vapor phase epitaxy (VPE), molecular beam epitaxy (MBE), and gas source MBE are available. In these procedures, precursor gases are utilized that interact with other precursor gases and/or with an energy source, i.e. heat, to yield formation of the desired material. Many common precursor gases such as arsine are quite toxic or present other handling considerations. (See The BOCA® National Fire Prevention Code/1987 Building Officials and Code Administrations, Int. Inc. 7th Ed. Country Club Hills, Ill. 60477, for a review of a variety of procedures utilizing precursors such as arsine in the fabrication of devices.) Although perfectly adequate devices have been made, the precursor is typically supplied from a compressed gas cylinder. For gases having properties such as high toxicity, the catastrophic failure of a compressed gas cylinder or lines leading directly from such cylinder is undesirable.

Few approaches to reduce possible problems associated with storage of large quantities of gases in device fabrication are available. In one approach, arsine is generated through the catalytic interaction of copper arsenide and phosphoric acid. The reactants are controlled so that the arsine generated is limited to the quantity necessary for immediate use in device fabrication. These processes produce arsine at a relatively low rate. Typically, arsine pressures less than 150 Torr are generated. Additionally, the subsequent disposal of the catalytic material and byproducts poses a significant problem. Thus, totally acceptable approaches for device fabrication utilizing a source of gas, other than a compressed gas source, are not presently available.

SUMMARY OF THE INVENTION

Electronic and/or optical devices are produced in a process which directly supplies gases such as arsine, stibine and germane by electrochemical in situ generation. Through the choice of appropriate electrolyte and electrodes the gas is generated at a very high efficiency (up to 97%), very little impurity is produced, and the electrolyte when spent is relatively innocuous, e.g. essentially only sodium hydroxide aqueous solution. Pressures of 20 psig or greater are easily generated and flow rates are expeditiously controlled to yield uniform delivery in the device fabrication process.

An exemplary device fabrication method involves the use of an electrochemical cell including solid arsenic electrodes and aqueous sodium hydroxide electrolyte. By applying current densities on the order of 20 $mA/cm^2$ or greater to the electrode, arsine gas pressures of 20 psig or greater are easily developed. Essentially no impurities are present except water vapor. The water vapor is expeditiously removed by treating the material with a molecular sieve. A small amount of hydrogen (up to 3%) is generated but as in many fabrication procedures, hydrogen is used as a carrier gas for the arsine and thus needs no removal.

DETAILED DESCRIPTION

Figure 1:
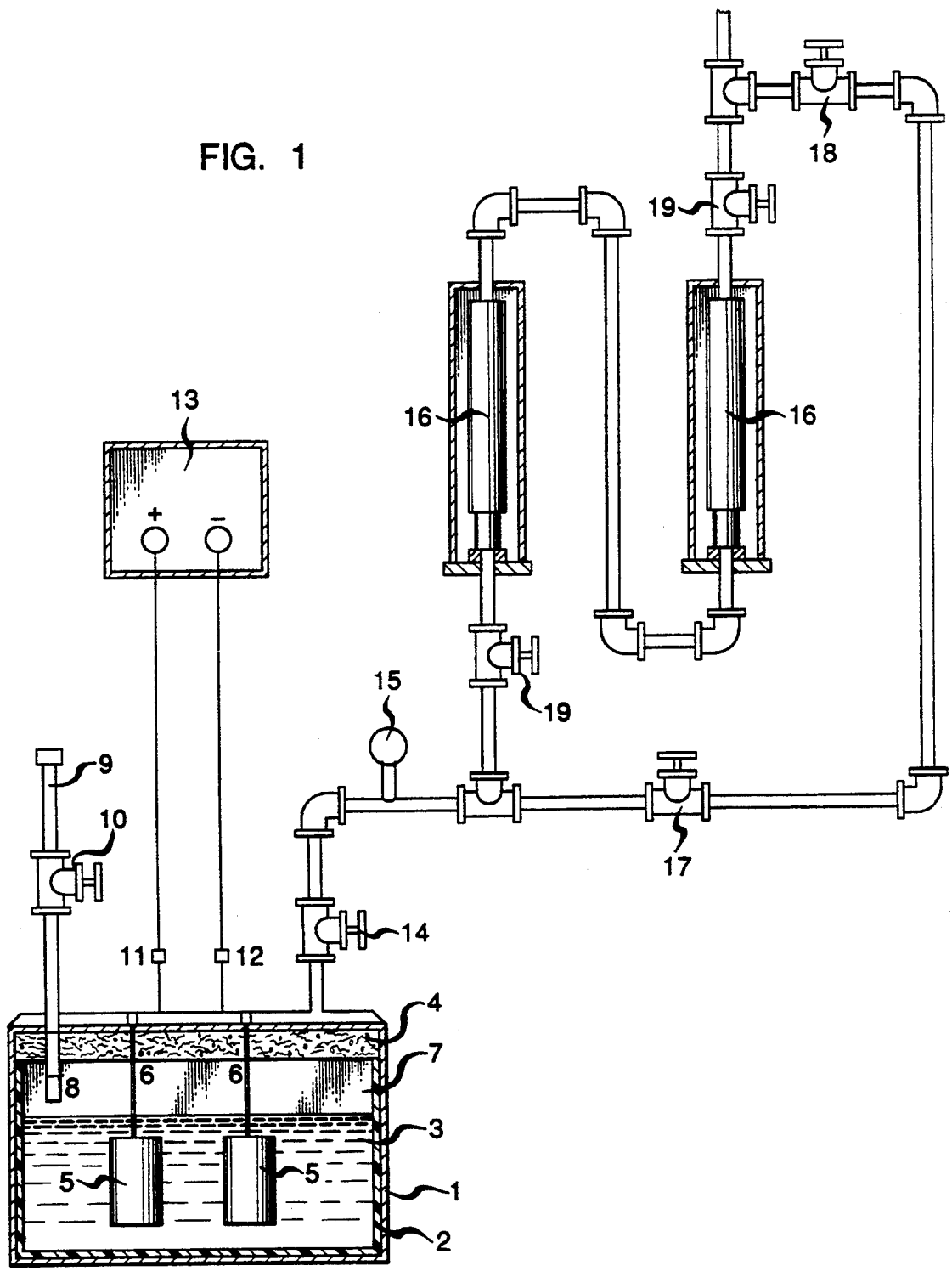
FIG. 1 is illustrative of an apparatus useful in practicing the invention.

The applicants have found that by using an electrochemical precursor gas generation process in a device fabrication sequence quite advantageous results are achieved. The electrochemical process is utilized to generate a gas that is then, in turn, utilized to form a material in the device structure. Device fabrication procedures such as described in, *Ann. Rev. Mater. Sci.* 12, 243-269 (1982) and *Journal of Crystal Growth* 6.8, 345-355 (1984), are well known and are hereby incorporated by reference. For example, device fabrication techniques using arsine are described in R. H. Moss, *Journal of Crystal Growth* 68, 78 (1984), M. J. Ludowise, C. B. Cooper III, and R. R. Saxena, *J. Electron. Mat.* 10, 1051 (1981), J. P. Duchenain, J. P. Hirtz, M. Razeghi, M. Bonnet, and S. D. Hersee, *J. Cryst. Growth* 55, 64 (1981), while device preparation techniques utilizing germane are disclosed in H. M. Manasenit, W. I. Simpson, *J. Electrochem. Soc.* 122, 444 (1971). These techniques are used in conjunction with at least one gas generated by electrochemical interaction that is directly employed in the fabrication procedure so that substantially no storage of this precursor gas is required, i.e. during the fabrication process less than 0.1 moles of at least one of the generated gases is present in the fabrication apparatus, including the gas generator, at any time.

The particular electrochemical cell utilized depends upon the specific gas to be generated. It has been found, however, in general that through appropriate choice of electrochemical conditions, pure precursor gases are produced at sufficiently high pressures, quantities and purity so that they are easily used in device fabrication techniques. The electrochemical cell includes an anode, a cathode, and an electrically conductive electrolyte in which the electrodes are at least partially immersed. Typically, cathodic reactions are utilized to produce the precursor gases. Thus, for example, a solid arsenic cathode is utilized for generation of arsine while solid antimony or germanium are utilized respectively for the generation of stibine and germane. For cathodic precursor generation, the composition of the anode is not critical. However, if oxygen is an undesirable impurity for the particular device fabrication sequence to be utilized, then inert electrodes such as platinum electrodes should not be employed.

In an advantageous embodiment, the cathode and anode are formed from the same material. This symmetry of electrodes has many advantages. It is possible to periodically change the current polarity to convert the anode into the cathode. In this manner, uniform use of both electrodes is ensured. Additionally, material, e.g. arsenic, consumed at the cathode is, in substantial part, replaced by the introduction of soluble entities from the anode into the electrolyte that migrate to the cathode and are converted to elemental material. Thus, for example, in the case of arsenic electrodes and a sodium hydroxide aqueous electrolyte, arsenic is converted into $AsO_2^-$ which is soluble in the aqueous electrolyte. This negative ion is transported to the cathode where it is electrochemically converted to arsenic for cathode replenishment.

Although solid electrodes such as solid arsenic electrodes are useful, more cost effective generation of precursor gas is produced by utilizing expedients such as packed bed electrodes. (See F. Goodridge and A. R. Wright, "Porous Flow-through and Fluidized-Bed Electrodes", in *Comprehensive Treatise of Electrochemistry*, Vol. 6, Chapter 6, p. 393, (1983), Plenum Press, New York, for a general description of packed bed electrodes.) The electrodes are produced by conventional techniques. For example, solid electrodes of arsenic or germanium are produced by the compression and sintering of arsenic particles.

Although two electrodes are sufficient for gas generation, the invention is not so limited. Configurations having multiple electrodes, e.g. a plurality of cathodes and anodes, are acceptable. Although the geometry of the electrode is not critical, it is typically desirable to use a geometry that leads to a relatively uniform current density throughout the electrode. If the current density is particularly nonuniform, portions of the electrode are preferentially consumed leading to shortened electrode life. Generally, the electrode should have a shape such that during operation no voids penetrate from a surface into the bulk a distance of more than 20% preferably more than 10%. Configurations such as two parallel plate electrodes or a cylindrical electrode surrounding a rod electrode are generally acceptable.

Generally, it is desirable to use an aqueous electrolyte to simplify reaction conditions and to substantially reduce the inconvenience associated with disposal of the electrolyte. To avoid production of impurities, it is typically desirable to use an aqueous electrolyte based on hydroxide mobile species. Thus, solutions including the alkali and alkaline-earth hydroxides are advantageously employed.

Generally, to avoid production of oxygen with electrodes such as arsenic electrodes where such production is unacceptable for the device fabrication sequence, a basic electrolyte should be employed. Typically, aqueous hydroxide electrolytes having a concentration between 0.1M and 10M are advantageously employed. Concentrations greater than 10M lead to some difficulty in handling and concentrations less than 0.1M, although not precluded, lead to decreased efficiency of gas generation. Through the use of a hydroxide electrolyte, the ratio of precursor gas to hydrogen generation is high. For example, in the generation of arsine through the use of an arsenic electrode and an aqueous hydroxide electrolyte, generation efficiencies of approximately 97% arsine relative to hydrogen are achieved.

Typically, in the operation of the electrochemical cell material from the electrode reaches a steady state concentration in the electrolyte. In some cases, before disposal of the electrolyte, it is desirable to remove this material. For example, in the case of arsine generation, $AsO_2^-$ entities are present in the electrolyte. Typically, the levels of this solubilized material are relatively low, e.g. around less than 0.5%. Nevertheless, if desired, the material is removable through deposition of arsenic from the electrolyte onto the cathode by applying a relatively small current density, i.e. current density in the range 1-2 $mA/cm^2$, between the cathode and an inert anode.

As previously discussed, the current density per unit surface area of reactive material in the electrode determines the rate at which the precursor gas is generated. Typically, reactive surface areas in the range 0.5 to 100 square inches are desirable. Surface areas greater than 100 square inches, although not precluded, are typically harder to produce while surface areas less than 0.5 square inches, although not precluded, are undesirable due to limited electrode lifetime. Additionally, current densities typically in the range 2 to 1000 $mA/cm^2$ are employed. Current densities greater than 1 $A/cm^2$ are generally unacceptable since they tend to induce sparks that could ignite any combustible gas present, e.g. hydrogen. Current densities less than 2 $mA/cm^2$, although not precluded, generally degrade gas generation efficiency.

For typical current densities a water mist is produced by the generated gas bubbling through the electrolyte and by heating of the electrolyte. It is desirable to suppress this mist generation, especially in device fabrication techniques sensitive to water, by using conventional expedients such as a mist suppressor. Commercial suppressors are available and are constructed from inert materials or stainless steel.

Typically, the reaction vessel is made sufficiently strong to endure the pressures required for the device fabrication sequence. Typically, pressures in the range 3 Torr to 30 psig are utilized for device fabrication. In particular, if mass gas flow controllers are utilized, pressures of about 20 psig or greater are required to ensure accurate functioning of the control. Generally, for fabrication gas pressures in the range 10 to 20 psig the vessel should be capable of enduring pressures in the range 100 to 300 psig.

The generated precursor gas is either used directly for device fabrication or is diluted with another gaseous material. For example, it is possible to introduce carrier gases such as hydrogen or inert carrier gases such as helium or argon. It is possible to introduce the precursor gas into the carrier downstream from the electrochemical generator or introduce the carrier gas into the electrochemical generator with subsequent flow of the mixture of carrier and the precursor gas from the generator.

The following examples are illustrative of the conditions useful in the practice of the invention.

EXAMPLE 1

The electrochemical cell unit, 1, was constructed from a stainless steel cell and inner-lined with Teflon ®, 2, for chemical inertness. Two ports were provided-an inlet port, 9, for gas purging of the cell with either hydrogen, argon, or helium and an outlet, 14, for the gases generated within the electrochemical unit. The cell unit had two electrical feedthroughs, 6, providing electrical contacts to the arsenic electrodes, 5, within the cell. A mist eliminator, 4, constructed from an inert material was included inside the electrochemical unit as depicted in FIG. 1 to reduce the aerosol water content in the generated gases exiting through the outlet port. A constant current power supply, 13, was used to provide a constant current to the cell. The positive pole on the power supply, 11, was connected to the arsenic anode electrode and the negative pole, 12, was connected to the arsenic cathode electrode. The exit port, 14, on the cell was connected in series to two commercially available molecular sieve cannisters, 16. The molecular sieves in this configuration reduced the water vapor content of the gases generated to less than 80 parts per billion by volume.

Arsine was electrochemically generated from an electrolyte, 3, of 1M NaOH (semiconductor grade, 99.99%) prepared with 18 MΩ-cm resistivity ultrapure Milli-Q water. The arsenic electrodes were made from high purity arsenic pieces (Aldrich, 99.9999%). Electrodes were fabricated by attaching an arsenic piece to one end of a 5-inch stainless steel rod with conductive silver epoxy paint. The end piece was cast inside a mold with organic resin epoxy producing an arsenic electrode. The steel rod provided electrical contact to the arsenic electrode in the cell.

Figure 2:
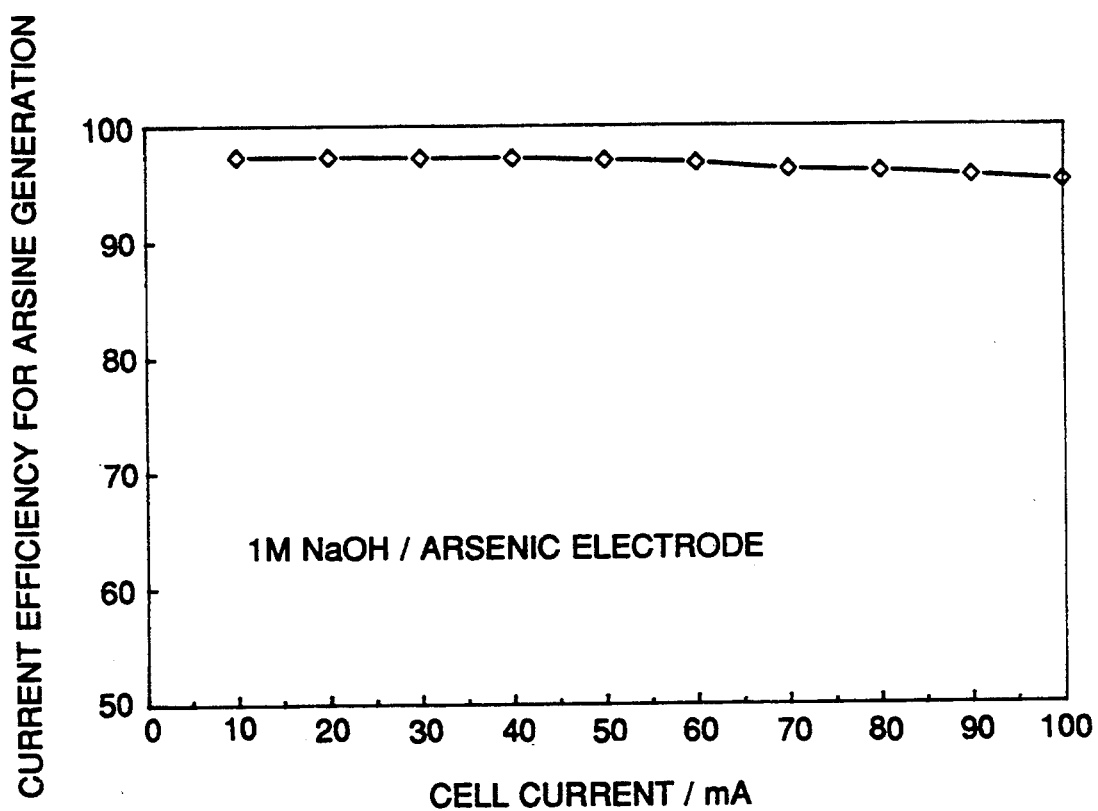
FIG. 2 is illustrative of efficiencies attainable in the generation of gases such as arsine.

Arsine generation was performed under galvanostatic (constant current) conditions by applying a given external current between the arsenic cathode electrode and the arsenic anode electrode. Constant current was supplied by a Harrison 6181A DC power supply and measured with a Kiethley 179 TRMS digital meter in series with the electrochemical cell. Prior to arsine generation, the electrochemical cell was purged with nitrogen gas at a flow rate of 20 standard cubic centimeters per minute through inlet 9 and valve 10 using bypass valves 17 and 18. Valve 10 was closed and the electrochemical cell was pumped down to a total system pressure of approximately 0.2 Torr, as monitored by a 10 Torr high precision MKS Barotron, 15. This procedure allowed on-line analysis of the gases generated within the electrochemical cell with a UTI mass spectrometer. The pumping was terminated, valves 17 and 18 were closed and valve 19 was opened. Current was applied at a level commensurate with the desired generation rate of arsine. The electrochemical cell was operated at pressures up to 30 psig or more for the generation of arsine. The current efficiency for arsine generation in the electrochemical cell is shown in FIG. 2 as a function of the applied cell current in units of milliamps. The current efficiency was found to be approximately 97% and was essentially constant with applied current.

We claim:

1. In a process for fabricating a device having a semiconductor material region, said process comprising the steps of 1) supplying a quantity of precursor gas and 2) employing said precursor gas in the formation of said material region the improvement being that said precursor gas comprises a hydride and is generated electrochemically through the interaction of a cathode and anode with an aqueous basic electrolyte while avoiding the substantial generation of oxygen whereby substantial storage of said precursor gas is avoided wherein said cathode comprises germanium and wherein said precursor gas comprises germane.

2. In a process for fabricating a device having a semiconductor material region, said process comprising the steps of 1) supplying a quantity of precursor gas and 2) employing said precursor gas in the formation of said material region the improvement being that said precursor gas comprises a hydride and is generated electrochemically through the interaction of a cathode and anode with an aqueous basic electrolyte while avoiding the substantial generation of oxygen whereby substantial storage of said precursor gas is avoided wherein said anode comprises arsenic and wherein said cathode comprises arsine.

3. In a process for fabricating a device having a semiconductor material region, said process comprising the steps of 1) supplying a quantity of precursor gas and 2) employing said precursor gas in the formation of said material region the improvement being that said precursor gas comprises a hydride and is generated electrochemically by the interaction of a cathode and anode with a basic aqueous electrolyte while avoiding the substantial generation of oxygen whereby substantial storage of said precursor gas is avoided wherein said cathode comprises antimony.

* * * * *